(12) United States Patent
Ushida et al.

(10) Patent No.: US 9,953,830 B2
(45) Date of Patent: Apr. 24, 2018

(54) METHOD OF MANUFACTURING SEMICONDUCTOR DEVICE, SUBSTRATE PROCESSING APPARATUS AND RECORDING MEDIUM

(71) Applicant: HITACHI KOKUSAI ELECTRIC INC., Tokyo (JP)

(72) Inventors: Takuro Ushida, Toyama (JP); Tsukasa Kamakura, Toyama (JP); Yoshiro Hirose, Toyama (JP); Kimihiko Nakatani, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/124,915

(22) PCT Filed: Mar. 13, 2014

(86) PCT No.: PCT/JP2014/056752
§ 371 (c)(1),
(2) Date: Sep. 9, 2016

(87) PCT Pub. No.: WO2015/136673
PCT Pub. Date: Sep. 17, 2015

(65) Prior Publication Data
US 2017/0018419 A1    Jan. 19, 2017

(51) Int. Cl.
*H01L 21/00* (2006.01)
*H01L 21/02* (2006.01)
(Continued)

(52) U.S. Cl.
CPC ........ *H01L 21/0228* (2013.01); *C23C 16/405* (2013.01); *C23C 16/45527* (2013.01);
(Continued)

(58) Field of Classification Search
CPC .................................................. H01L 21/0228
See application file for complete search history.

(56) References Cited

U.S. PATENT DOCUMENTS

2008/0113096 A1    5/2008  Mahajani
2009/0104792 A1    4/2009  Miya et al.
(Continued)

FOREIGN PATENT DOCUMENTS

JP    2008-142702 A    6/2008
JP    2010-219500 A    9/2010
(Continued)

OTHER PUBLICATIONS

Japanese Office Action for Japanese Patent Application No. 2016-507209 dated Jan. 5, 2017 (with English translation).
(Continued)

*Primary Examiner* — William Harriston
(74) *Attorney, Agent, or Firm* — Volpe and Koenig, P.C.

(57) ABSTRACT

A method of manufacturing a semiconductor device includes forming an oxide film containing a metal element on a substrate by performing a cycle a predetermined number of times, the cycle including non-simultaneously performing: supplying a precursor containing a metal element and a halogen group to the substrate; and supplying an oxidant to the substrate. In the act of supplying the oxidant, a catalyst is supplied to the substrate together with the oxidant. In the act of supplying the precursor, the catalyst is not supplied to the substrate.

12 Claims, 10 Drawing Sheets

(51) Int. Cl.
C23C 16/40 (2006.01)
C23C 16/455 (2006.01)
C23C 16/52 (2006.01)

(52) U.S. Cl.
CPC ........ *C23C 16/45534* (2013.01); *C23C 16/52* (2013.01); *H01L 21/02186* (2013.01); *H01L 21/02277* (2013.01)

(56) References Cited

U.S. PATENT DOCUMENTS

| | | |
|---|---|---|
| 2012/0126355 A1 | 5/2012 | Mizuno et al. |
| 2014/0287595 A1* | 9/2014 | Shimamoto ....... H01L 21/02126 438/774 |

FOREIGN PATENT DOCUMENTS

| | | |
|---|---|---|
| JP | 2011-176330 A | 9/2011 |
| JP | 2012-114223 A | 6/2012 |

OTHER PUBLICATIONS

Office Action in KR counterpart Application No. 10-2016-7024828 dated Oct. 19, 2017.

* cited by examiner

FIG. 13
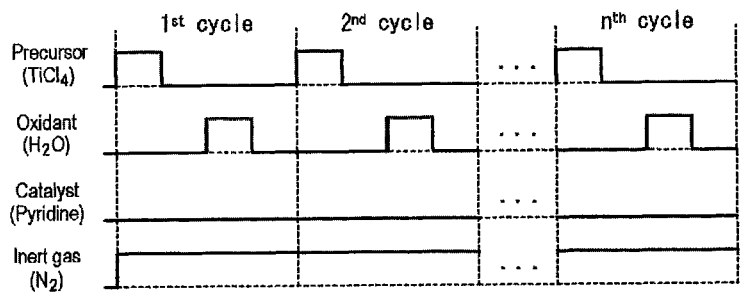
FIG. 14A
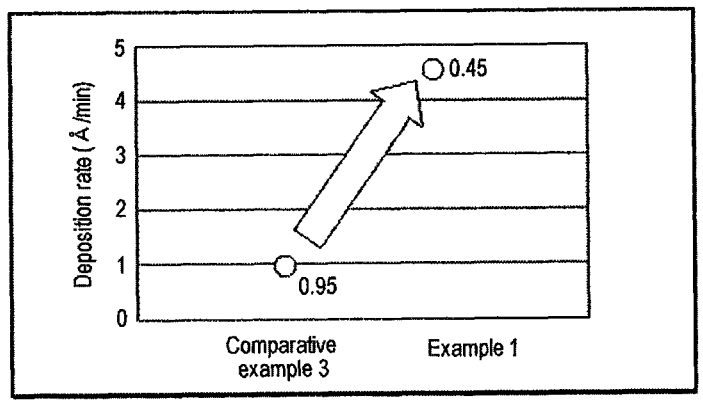
FIG. 14B
| | Deposition rate | Visual configuration (Presence or absence of foreign matter) |
|---|---|---|
| Example 1 | 4.57 Å /min | Absent |
| Comparative example 1 | – | Present |
| Comparative example 2 | – | Present |
| Comparative example 3 | 0.95 Å /min | Absent |

FIG. 17A

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

Triethylamine(TEA)
Acid dissociation constant(pKa) 10.7

Diethylamine (DEA)
Acid dissociation constant(pKa) 10.9

Monoethylamine (MEA)
Acid dissociation constant(pKa) 10.6

Trimethylamine (TMA)
Acid dissociation constant(pKa) 9.8

Monomethylamine(MMA)
Acid dissociation constant(pKa) 10.6

METHOD OF MANUFACTURING SEMICONDUCTOR DEVICE, SUBSTRATE PROCESSING APPARATUS AND RECORDING MEDIUM

TECHNICAL FIELD

The present disclosure relates to a method of manufacturing a semiconductor device a substrate processing apparatus and a recording medium.

BACKGROUND

As an example of processes of manufacturing a semiconductor device, a process of supplying a precursor containing a metal element and an oxidant to a substrate and forming an oxide film containing a metal element on the substrate is often carried out.

SUMMARY

The present disclosure provides a technique which is capable of enhancing, the productivity of a film forming process and improving a film quality when an oxide film containing a metal element is formed on a substrate using a precursor and an oxidant.

According to one embodiment of the present disclosure, there is provided a method of manufacturing a semiconductor device, including forming an oxide film containing a metal element on a substrate by performing a cycle a predetermined number of times, the cycle including non-simultaneously performing:

supplying a precursor containing the metal element and a halogen group to the substrate; and supplying an oxidant to the substrate, wherein in the act of supplying the oxidant, a catalyst is supplied to the substrate together with the oxidant, and in the act of supplying the precursor, the catalyst is not supplied to the substrate.

According to another embodiment of the present disclosure, there is provided a substrate processing apparatus, including:

a process chamber configured to accommodate a substrate;

a precursor supply system configured to supply a precursor containing a metal element and a halogen group to the substrate accommodated in the process chamber;

an oxidant supply system configured to supply an oxidant to the substrate accommodated in the process chamber;

a catalyst supply system configured to supply a catalyst to the substrate accommodated in the process chamber; and a control part configured to control the precursor supply system, the oxidant supply system and the catalyst supply system so as to perform forming an oxide film containing the metal element on the substrate by performing a cycle a predetermined number of times, the cycle including non simultaneously performing: supplying the precursor to the substrate accommodated in the process chamber; and supplying the oxidant to the substrate accommodated in the process chamber, wherein in the act of supplying the oxidant, the catalyst is supplied to the substrate together with the oxidant, and in the act of supplying the precursor, the catalyst is not supplied to the substrate.

According to a further embodiment of the present disclosure, there is provided a non-transitory computer-readable recording medium storing a program that causes a computer to perform forming an oxide film containing a metal element on a substrate by performing a cycle a predetermined number of times, the cycle including non-simultaneously performing:

supplying a precursor containing the metal element and a halogen group to the substrate accommodated in a process chamber; and supplying an oxidant to the substrate accommodated in the process chamber wherein in the act of supplying the oxidant, a catalyst is supplied to the substrate together with the oxidant, and in the act of supplying the precursor, the catalyst is not supplied to the substrate.

According to the present disclosure, it is possible to enhance the productivity of a film forming process and improve a film quality when an oxide film containing a metal element is formed on a substrate using a precursor and an oxidant.

BRIEF DESCRIPTION OF THE DRAWINGS

FIG. 13 is a view illustrating gas supply timings in a film forming, sequence according to comparative example 3.

FIG. 14A is a view illustrating some evaluation results of deposition rates of TiO films.

FIG. 14B is a view collectively illustrating evaluation results of deposition rates of TiO films and visual inspection thereof.

FIG. 17A is a view illustrating names, chemical composition formulae, chemical structural formulae and acid dissociation constants of cyclic amines.

DETAILED DESCRIPTION

One Embodiment

One embodiment of the present disclosure will now be described with reference to FIGS. 1 to 3.

(1) Configuration of Substrate Processing Apparatus

Figure 1:
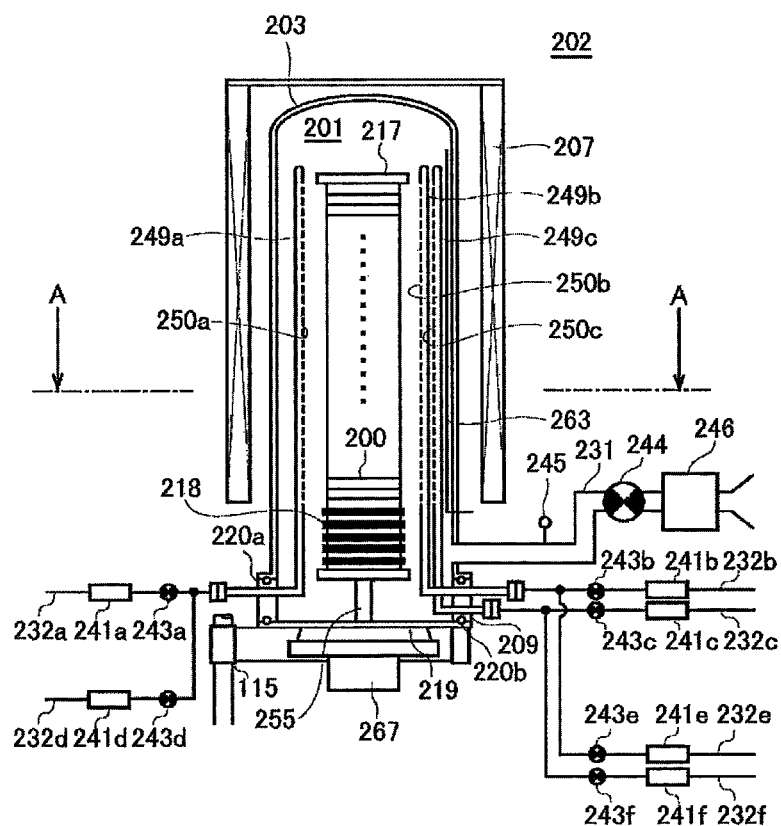
FIG. 1 is a schematic configuration view of a vertical processing furnace of a substrate processing apparatus used in one embodiment of the present disclosure, in which a portion of the processing furnace is shown in a vertical cross section.
Figure 2:
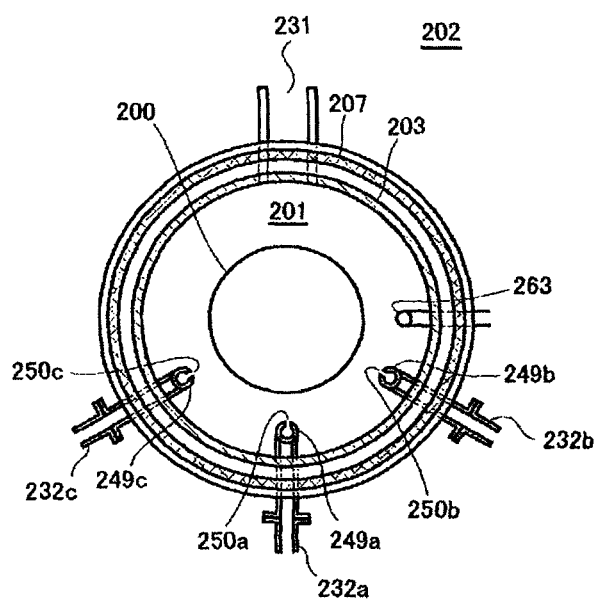
FIG. 2 is a schematic configuration view of the vertical processing furnace of the substrate processing, apparatus used in one embodiment of the present disclosure, in which a portion of the processing furnace is shown in a cross section taken along line A-A in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, stainless steel (SUS), and has a cylindrical shape with its upper and lower ends opened. The upper end of the manifold 209 engages with a lower end of the reaction tube 203 so that the manifold 209 is configured to support the reaction tube 203. An O-ring 220a as a seal member is installed between the manifold 209 and the reaction tube 203. The manifold 209 is supported by the heater base. Thus, the reaction tube 203 is kept in a vertically-mounted state. A processing vessel (reaction vessel is mainly configured by the reaction tube 203 and the manifold 209. A process chamber 201 is formed in a hollow cylindrical portion of the processing vessel. The process chamber 201 is configured to accommodate a plurality of wafers 200 as substrates. The wafers 200 are horizontally stacked in multiple-stage along a vertical direction in a boat 217 which will be described later.

Nozzles 249a to 249c are installed inside the process chamber 201 so as to penetrate through the manifold 209. The nozzles 249a to 249c are made of, e.g., a heat resistant material such as quartz, SiC or the like. Gas supply pipes 232a to 232c are respectively connected to the nozzles 249a to 249c. In this way, the three nozzles 249a to 249c and the three gas supply pipes 232a to 232c are installed in the reaction tube 203 and are configured to supply plural kinds of gases into the process chamber 201.

Mass flow controllers (MFC) 241a to 241c used as flow rate controllers (flow rate control parts), and valves 243a to 2430 used as opening/closing valves, are installed in the gas supply pipes 232a to 232c sequentially from respective upstream sides. Gas supply pipes 232d to 232f, which supply an inert gas, are respectively connected to the gas supply pipes 232a to 232c at the downstream side of the valves 243a to 243c. MFCs 241d to 241f used as flow rate controllers (flow rate control pans), and valves 243d to 243f used as opening/closing valves, are installed in the gas supply pipes 232d to 232f sequentially from respective upstream sides.

The nozzles 249a to 249c are respectively connected to end portions of the gas supply pipes 232a to 232c. As shown in FIG. 2, the nozzles 249a to 249c are disposed in an annular space defined between the inner wall of the reaction tube 203 and the wafers 200 such that the nozzles 249a to 249c extend upward along a stack direction of the wafers 200 from a lower portion of the inner wall of the reaction tube 203 to an upper portion thereof. Specifically, the nozzles 249a to 249c are installed along a wafer arrangement region in which the wafers 200 are arranged and in a region that horizontally surrounds the wafer arrangement region at a side of the wafer arrangement region. Each of the nozzles 249a to 249c is configured as an L-shaped long nozzle. A horizontal portion of each of the nozzles 249a to 249c is installed to penetrate a sidewall of the manifold 209. A vertical portion of each of the nozzles 249a to 249c is installed to extend upward at least from one end portion of the wafer arrangement region toward the other end portion thereof. A plurality of gas supply holes 250a to 250e through which a gas is supplied, is formed in a lateral side of each of the nozzles 249a to 249d, respectively. Each of the gas supply holes 250a to 250c is opened toward the center of the reaction tube 203 to allow the gas to be supplied toward the wafers 200. The gas supply holes 250a to 250c may be formed in a plural number so as to span from the lower portion of the reaction tube 203 to the upper portion thereof. The respective gas supply holes 250a to 250c may have the same opening area and may be formed at the same opening pitch.

As described above, in this embodiment, a gas is supplied through the nozzles 249a to 249c, which are disposed in the vertically-elongated annular space, i.e., a cylindrical space, defined by the inner wall of the reaction tube 203 and the end portions of the stacked wafers 200. The gas is initially injected into the reaction tube 203, near the wafers 200, through the gas supply holes 250a to 150c formed in the nozzles 249a to 249c. Accordingly, the gas supplied into the reaction tube 203 mainly flows in a direction parallel to surfaces of the wafers 200, i.e., in a horizontal direction. With this configuration, the gas can be uniformly supplied to the respective wafers 200. This makes it possible to improve the uniformity of a thickness of a thin film formed on each of the wafers 200. The gas flowing on the surfaces of the wafers 200, i.e., the reacted residual gas, flows toward an exhaust port, i.e., an exhaust pipe 231 which will be described later. The flow direction of the residual gas is not limited to a vertical direction but may be appropriately decided depending on the position of the exhaust port.

A precursor containing a metal element and a halogen element, for example, a titanium halide precursor gas containing titanium (Ti) as a metal element and a halogen element, is supplied from the gas supply pipe 232a into the process chamber 201 via the MFC 241a, the valve 243a and the nozzle 249a.

The titanium halide precursor gas refers to a gaseous titanium halide precursor, for example, a gas obtained by vaporizing nozzles a titanium halide precursor which remains in a liquid state under room temperature and atmospheric pressure, or a titanium halide precursor which remains in a gas state under room temperature and atmospheric pressure. The titanium halide precursor refers to a titanium precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like, an be said at the titanium halide precursor is one kind of metal halide or one kind of halide. When the term "precursor" is used herein, it may refer to "a liquid precursor staying in a liquid state," "a precursor gas staying in a gaseous state," or both.

As the titanium halide precursor gas, it may be possible to case, for example, a precursor gas containing Ti and Cl, namely a chloro titanium precursor gas. As the chloro titanium precursor gas, it may be possible to use, for example, a titanium tetrachloride ($TiCl_4$) gas. The $TiCl_4$ gas is amino-group-free gas, namely nitrogen (N)-free gas and carbon (C)-free gas. In the case of us a liquid precursor, such as a $TiCl_4$ or the like, which stays in a liquid state under room temperature and atmospheric pressure, the liquid precursor is vaporized by a vaporization system such as a vaporizer or a bubbler and is supplied as a precursor gas ($TiCl_4$ gas).

An oxidant is supplied from the gas supply pipe 232b into the process chamber 201 via the MFC 241b the valve 243b and the nozzle 249b. As the oxidant, it may be possible to use, for example, an oxygen-containing gas (oxidizing gas) such as water vapor ($H_2O$ gas) or the like. For example, pure water (or ultrapure water), such as RO water from which impurities are removed using a reverse osmosis membrane, deionized water from which impurities are removed by performing, a deionization treatment, distilled water from which impurities are removed through distillation using a distillation device, or the like, is vaporized by a vaporization system such as a vaporizer, bubbler or a boiler and is supplied as an oxidant ($H_2O$ gas).

A catalyst which promotes an oxidation reaction generated by the oxidant described above is supplied from the gas supply pipe 232c into the process chamber 201 via the MFC 241c, the valve 243c and the nozzle 249c. As the catalyst, it may be possible to use, for example, an amine-based gas containing C, N and H.

The amine-based gas is a gas which includes amine obtained by substituting at least one of H atoms of ammonia ($NH_3$) with a hydrocarbon group such as an alkyl group or the like. As illustrated in FIGS. 17A to 17F, amine which includes N having a lone pair of electrons and which has an acid dissociation constant (hereinafter also referred to as pKa) of, e.g., about 5 to 11 may be used as a catalyst. The acid dissociation constant (pKa) is one index quantitatively indicating the strength of an acid. The acid dissociation constant (pKa) refers to a negative common logarithm which represents an equilibrium constant Ka in a dissociation reaction in which H ions are released from an acid. As the amine-based gas, it may be possible to use a cyclic amine-based gas in which hydrocarbon groups have a cyclic shape, or a chain amine-based gas in which hydrocarbon groups have a chain shape.

As the cyclic amine-based gas, it may be possible to use, e.g., a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, or as piperidine ($C_5H_{11}N$, pKa=11.12) gas, as illustrated in FIG. 17A. It can be said that the cyclic amine-based gas is a heterocyclic compound whose cyclic structure is formed by plural kinds of elements such as C and N, namely as nitrogen-containing heterocyclic compound.

As the chain amine-based gas, it may be possible to use, e.g., a triethylamine (($C_2H_5)_3N$, abbreviation: TEA, pKa=10.7) gas, a diethylamine (($C_2H_5)_2NH$, abbreviation: DEA, pKa=10.9) gas, a monoethylamine (($C_2H_5)NH_2$, abbreviation: MEA, pKa=10.6) gas, a trimethylamine (($CH_3)_3N$, abbreviation: TMA, pKa=9.8) gas, or a monomethylamine $CH_3)NH_2$, abbreviation: MMA, pKa=10.6) gas, as illustrated in FIGS. 12B to 12F.

The amine-based gas acting as a catalyst may be referred to as an amine-based catalyst or an amine-based catalyst gas. As the catalyst, in addition to the amine-based gas mentioned above, it may be possible to use a non-amine-based gas, e.g., an ammonia ($NH_3$, pKa=9.2).

It is sometimes the case that the molecular structure of the catalyst illustrated herein is partially decomposed in a film forming process to be described later. Such a substance which partially undergoes a change before and after a chemical reaction is not a "catalyst" in a strict meaning. However, in the subject specification, a substance which is partially decomposed but not mostly decomposed in the course of a chemical reaction and which changes a reaction speed and substantially acts as a catalyst will be referred to as a "catalyst".

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c, respectively.

In the case of supplying the aforementioned precursor from the gas supply pipe 232a, a precursor supply system is mainly configured by the gas supply pipe 232a, the MFC 241a and the valve 243a. The precursor supply system may also include the nozzle 249a. The precursor supply system may be referred to as a precursor gas supply system. In the case of supplying a titanium halide precursor gas from the gas supply pipe 232a, the precursor supply system may be referred to as a titanium halide precursor supply system or a titanium halide precursor gas supply system.

In the case of supplying the aforementioned oxidant from the gas supply pipe 232b, an oxidant supply system is mainly configured by the gas supply pipe 232b, the MFC 241b, and the valve 243b. The oxidant supply system may also include the nozzle 249b. The oxidant supply system may be referred to as a reaction gas supply system, an oxygen-containing gas supply system or an oxidizing gas supply system.

In the case of supplying the aforementioned catalyst from the gas supply pipe 232c, a catalyst supply system is mainly configured by the gas supply pipe 232c, the MFC 241c, and the valve 243c. The catalyst supply system may also include the nozzle 249c. In the case of supplying an amine-based gas from the gas supply pipe 232c, the catalyst supply system may be referred to as an amine-based catalyst supply system, an amine-based gas supply system or an amine supply system.

In addition, an inert gas supply system is mainly configured by the gas supply pipes 232d to 232f, the MFCs 241d to 241f and the valves 243d to 243f. The inert gas supply system may be referred to as a purge gas supply system or a carrier gas supply system.

An exhaust pipe 231 for exhausting an internal atmosphere of the process chamber 201 is installed in the reaction tube 203. A vacuum pump 246 as a vacuum exhaust device is coupled to the exhaust pipe 231 via a pressure sensor 245 as a pressure detector (pressure detecting part) for detecting the internal pressure of the process chamber 201, and an auto pressure controller (APC) valve 244 as an exhaust valve (pressure regulating part). The APC valve 244 is configured to perform or stop vacuum exhaust in the process chamber 201 by opening or closing the valve while actuating the vacuum pump 246 and is also configured to regulate the internal pressure of the process chamber 201 by adjusting an opening degree of the valve pursuant to a pressure information detected by the pressure sensor 245 while actuating the vacuum pump 246. An exhaust system is mainly configured by the exhaust pipe 231, the APC valve 244 and the pressure sensor 245. The exhaust system may include the vacuum pump 246. The exhaust pipe 231 may not be installed in the reaction tube 203. Similar to the nozzles 249a to 249c, the exhaust pipe 231 may be installed in the manifold 209.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotary mechanism 267 configured to rotate a boat 217 (which will be described later) is installed at a side of the seal cap 219 opposite to the process chamber 201. A rotary shaft 255 of the rotary mechanism 267, which extends through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and out of the process chamber 201 by moving the seal cap 219 up and down. As such, the boat elevator 115 is configured as a transfer device (transfer mechanism) which transfers the boat 217 and the wafers 200 supported by the boat 217, into and out of the process chamber 201.

The boat 217 serving as a substrate holder is configured to support a plurality of, e.g., 25 to 200 wafers 200 in such a state that the wafers 200 are arranged in a horizontal posture and in multiple stages along a vertical direction, namely arranged in a spaced-apart relationship, with the centers of the wafers 200 concentrically aligned, with one another. The boat 217 is made of e.g., a heat resistant material such as quartz or SiC. Heat insulation plates 218 made of, e.g., a heat resistant material such as quartz or SiC are installed below the boat 217 in a horizontal posture and in multiple stages. With this configuration, it is hard for the heat generated in the heater 207 to be radiated to the seal cap 219. However, this embodiment is not limited to the above-described configuration. For example, instead of installing the heat insulating plates 218 below the boat 217, a heat insulating tube as a tubular member made of a beat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a predetermined temperature distribution. Similar to the nozzles 249a to 249c, the temperature sensor 263 is formed in an L-shape. The temperature sensor 263 is installed along the inner wall of the reaction tube 203.

Figure 3:
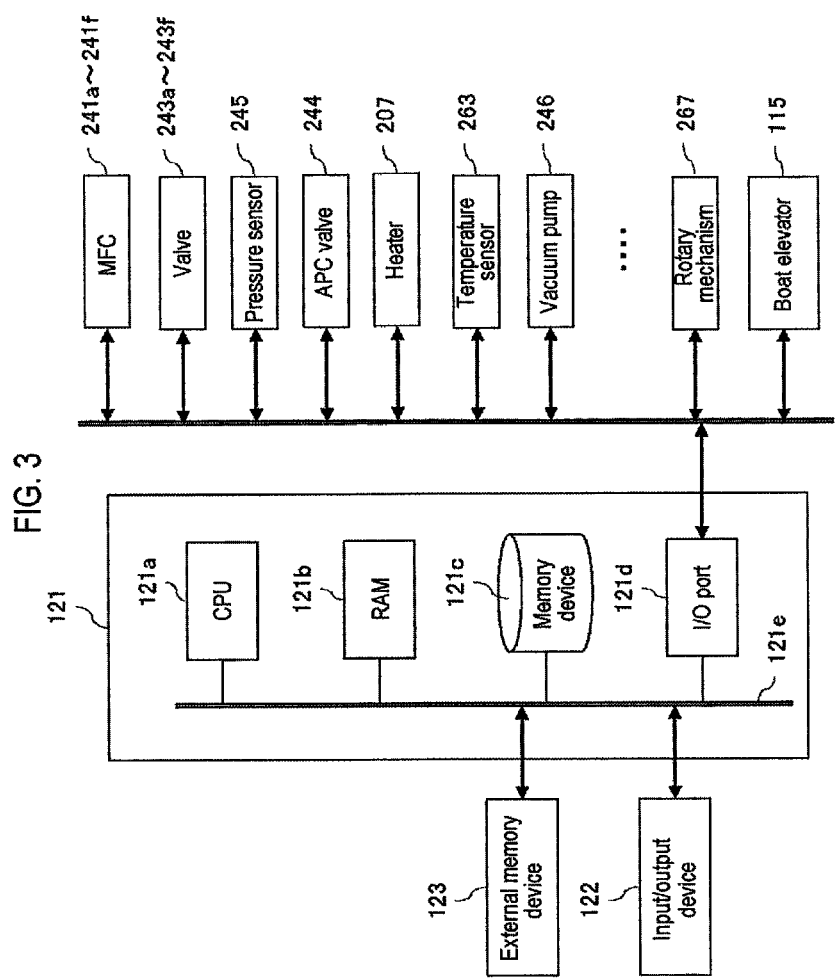
FIG. 3 is a schematic configuration view of a controller of the substrate processing apparatus used in one embodiment of the present disclosure, in which a control system of the controller is shown in a block diagram.

As illustrated in FIG. 3, a controller 121 as a control part (control means) is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 configured as, e.g., a touch panel or the like, is connected to the controller 121.

The memory device 121c is configured by, for example, a flash memory, a hard disc drive (HDD), or the like. A control program for controlling operations of a substrate processing apparatus or a process recipe in which a sequence or condition of a substrate process (to be described later) is written, is readably stored in the memory device 121c. The process recipe functions as a program for causing the controller 121 to execute each sequence of the substrate process (to be described later), to obtain a predetermined result. Hereinafter, such a process recipe or control program will be collectively referred to as a "program," When the term "program" is used herein, it may indicate a case of including a process recipe, a case of including a control program, or a case of including both a process recipe and a control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a is also configured to read the process recipe from the memory device 121c according to an input of an operation command from the input/output device 122. The CPU 121a is configured to, according to contents of the process recipe thus read, control the flow rate adjusting operation of various kinds of gases performed by the MFCs 241a to 241f, the opening/closing operation of the valves 243a to 243f, the opening/closing operation of the APC valve 244, the pressure regulating operation performed by the APC valve 244 based on the pressure sensor 245, the start/stop operation of the vacuum pump 246, the temperature adjusting operation performed by the heater 207 based on temperature sensor 263, the operation of rotating the boat 217 with the rotary mechanism 267 and adjusting the rotation speed of the boat 17, the operation of moving the boat 217 up and down with the boat elevator 115, and the like.

The controller 121 is not limited to being configured as a dedicated computer but may be configured as a general-purpose computer. The controller 121 according to this embodiment may be configured by preparing an external memory device 123 (e.g., a magnetic tape, a magnetic disc such as a flexible disc a hard disc, an optical disc such as a CD or a DVD, magneto-optical disc such as an MO, or a semiconductor memory such as a USB memory or a memory card) which stores the aforementioned program and installing a program in a general-purpose computer using the external memory devices 123. However a means for supplying a program to a computer is not limited to a case where the program is supplied through the external memory device 123. For example, the program may be supplied using a communication means such as the Internet or a dedicated line without going through the external memory device 123. The memory device 121c or the external memory device 123 is configured as a computer-readable recording medium. Hereinafter, the memory device 121c and the external memory device 123 will be collectively and simply referred to as a "recording medium." When the "recording medium" is used herein, it may indicate a case of including the memory device 121c, a case of including the external memory device 123, or a case of including both the memory device 121c and the external memory device 123.

(2) Film Forming Process

An example of a sequence for forming an oxide film containing a metal element, which is one of a semiconductor device manufacturing processes using the aforementioned substrate processing apparatus, will now be described with reference to FIG. 4. In the following descriptions, operations of respective pans constituting the substrate processing apparatus are controlled by the controller 121.

In a film forming sequence illustrated in FIG. 4, a titanium oxide film ($TiO_2$ film; hereinafter also referred to as a TiO film) as an oxide film containing Ti is formed on a wafer 200 by performing, a predetermined number of times (a times), a cycle that non-simultaneously or non-synchronously performs:

a step of supplying a $TiCl_4$ gas as a precursor containing a metal element and a halogen group to the wafer 200 as a substrate; and a step of supplying a $H_2O$ gas as an oxidant to the wafer 200.

In the step of supplying the $H_2O$ gas, a pyridine gas as a catalyst is supplied to the wafer 200 together with the $H_2O$ gas. In the step of supplying the $TiCl_4$ gas, the pyridine gas is not supplied to the wafer 200.

In this embodiment, the expression "performing a cycle a predetermined number of times" means that the cycle is performed once or multiple times, namely that the cycle is performed once or more. FIG. 4 illustrates an example in which the cycle is repeated n times.

As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body".

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer" In this case, the term "wafer" and "substrate" may be used interchangeably in the above descriptions.

(Wafer Charging and Boat Loading)

If a plurality of wafers 200 is charged to the boat 217 (in a wafer charging), as illustrated in FIG. 1, the boat 217 in which the plurality of wafers 200 is accommodated is lifted up by the boat elevator 115 and is loaded into the process chamber 201 (in a boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-exhausted (depressurized and exhausted) by the vacuum pump 246 so as to reach a predetermined pressure (predetermined vacuum level). In this operation, the internal pressure of the process chamber 201 is measured by the pressure sensor 245. The APC valve 244 is feedback-controlled based on the measured pressure information. The vacuum pump 246 may be continuously activated at least until the process of the wafers 200 is completed. The wafers 200 in the process chamber 201 are heated by the heater 207 to a predetermined film formation temperature. In this operation, the state of supplying electric power to the heater 207 is feedback-controlled based on the temperature information detected by the temperature sensor 263 such that the interior of the process chamber 201 reaches a predetermined temperature distribution. The heating of the interior of the process chamber 201 by the heater 207 may be continuously performed at least until the process of the wafers 200 is completed. The boat 217 and the wafers 200 begin to be rotated by the rotary mechanism 267. The rotation of the boat 217 and the wafers 200 by the rotary mechanism 267 may be continuously performed at least until the process of the wafers 200 is completed.

(TiO Film Forming Process)

Thereafter, the following two steps, namely steps 1 and 2, are sequentially implemented.

[Step 1]

($TiCl_4$ Gas Supply)

The valve 243a is opened to allow a $TiCl_4$ gas to flow through the gas supply pipe 232a. The flow rate of the $TiCl_4$ gas is adjusted by the MFC 241a. The $TiCl_4$ gas is supplied into the process chamber 201 through the gas supply holes 250a and is exhausted from the exhaust pipe 231. At this time the $TiCl_4$ gas is supplied to the wafers 200. At the same time the valve 243d is opened to allow an $N_2$ gas to flow through the gas supply pipe 232d. The flow rate of the $N_2$ gas is adjusted by the MFC 241d. The $N_2$ gas is supplied into the process chamber 201 together with the $TiCl_4$ gas and is exhausted from the exhaust pipe 231.

In order to prevent entry of the $TiCl_4$ gas into the nozzles 249b and 249c, the valves 243e and 243f are opened to allow the $N_2$ gas to flow through the gas supply pipes 232e and 232f. The $N_2$ gas is supplied into the process chamber 201 through the gas supply pipes 232b and 232c and the nozzles 249b and 249c and is exhausted from the exhaust pipe 231.

The supply flow rate of the $TiCl_4$ gas controlled by the MFC 241a is set at a flow rate which falls within a range of, for example, 10 to 2000 sccm, specifically 10 to 1,000 sccm. The supply flow rates of the $N_2$ gas controlled by the MFCs 241d to 241f are respectively set at a flow rate which falls within a range of for example, 100 to 10,000 sccm. A period of time during which the TiCl$_4$ gas is supplied to the wafers 200, namely the gas supply time period (irradiation time period), is set at a time period which falls within a range of, for example, 1 to 30 seconds, specifically 1 to 20 seconds, more specifically 1 to 10 seconds. If the supple time period of the TiCl$_4$ gas is too long, there may be a case where the thickness of a film as formed becomes unstable. This can be alleviated or eliminated by setting the supply time period of the TiCl$_4$ gas at 30 seconds or less, specifically 20 seconds or less, more specifically 10 seconds or less. Furthermore, the supply time period of the TiCl$_4$ gas may be set equal to or shorter than the supply time period of the H$_2$O gas, which will be described later.

At this time the APC valve 244 is appropriately adjusted to set the internal pressure of the process chamber 201 at a pressure which falls within a range of, for example, 30 to 400 Pa, specifically 30 to 133 Pa. If the internal pressure of the process chamber 201 exceeds 400 Pa, an excessive gas phase reaction (CVD reaction) is generated. Thus, the uniformity of the thickness of a first layer to be described later, namely the uniformity of the thickness of a finally-formed TiO film, is likely to degrade and is difficult to control. Furthermore, particles are likely to be generated within the process chamber 201 and the quality of the TiO film is likely to degrade. By setting, the internal pressure of the process chamber 201 at 400 Pa or less, it is possible to sufficiently suppress the excessive gas phase reaction from being generated within the process chamber 201. By setting the internal pressure of the process chamber 201 at 133 Pa or less, it is possible to further sufficiently suppress the excessive gas phase reaction from being generated within the process chamber 201.

At this time, the temperature of the heater 207 is set such that the temperature of the wafers 200 becomes a temperature which falls within a range of, for example, room temperature or more and 300 degrees C. or less, specifically room temperature or more and 200 degrees C. or less, more specifically room temperature or more and 100 degrees C. or less.

It is difficult to perform the film forming process at the temperature of the wafers 200 at less than room temperature. For example, if the temperature of the wafers 200 is less than room temperature, it becomes difficult for TiCl$_4$ to be chemically adsorbed onto the wafers 200. As a result, there may be a case where the formation rate of a first layer to be described, later, namely the deposition rate of a finally-formed TiO film, is reduced. Moreover, the amount of Cl remaining in the first layer is likely to be increased so that the quality of the TiO film is reduced. By setting the temperature of the wafers 200 at room temperature or more, it is possible to promote the chemical adsorption of TiCl$_4$ onto the wafers 200. This makes it possible to increase the formation rate of the first layer, namely the deposition rate of the finally-formed TiO film. In addition, by setting the temperature of the wafers 200 at room temperature or more, it is possible to reduce the amount of Cl remaining in the first layer, thus improving the quality of the TiO film.

If the temperature of the wafers 200 exceeds 300 degrees C., the first layer formed on each of the wafers 200 is crystallized so that a surface roughness of the first layer, namely a surface roughness of the TiO film, is likely to degrade. Furthermore, the TiCl$_4$ adsorbed onto the wafers 200 is likely to be desorbed so that the formation rate of the first layer, namely the deposition rate of the finally-formed TiO film, is likely to be reduced. The term "surface roughness" refers to a height difference within a wafer plane or an arbitrary target plane and has the same meaning as a surface coarseness. The expression "the surface roughness is improved (good)" means that the height difference is decreased (small), namely that the surface is smoothened (smooth). The expression "the surface roughness is degraded (poor)" means that the height difference is increased (large), namely that the surface is roughened (rough).

By setting the temperature of the wafers 200 at 300 degrees C. or less, it is possible to suppress the crystallization of the first layer, thus improving the surface roughness of the first layer, namely the surface roughness of the TiO film. Furthermore, it is possible to suppress desorption of the TiCl$_4$ adsorbed onto the wafers 200, thus increasing the deposition rate of the TiO film. Moreover, it is possible to reduce the amount of heat applied to the wafers 200, thus satisfactorily performing the control of thermal hysteresis suffered by the wafers 200.

By setting the temperature of the wafers 200 at 200 degrees C. or less, ultimately 100 degrees C. or less, it is possible to reliably suppress the crystallization of the first layer, thus further improving, the surface roughness of the first layer, namely the surface roughness of the TiO film. Furthermore, it is possible to further suppress desorption of the TiCl$_4$ adsorbed onto the wafers 200, thus further increasing the deposition rate of the TiO film. Moreover, it is possible to further reduce the amount of heat applied to the wafers 200, thus further satisfactorily performing the control of thermal hysteresis suffered by the wafers 200.

For that reason, the temperature of the wafers 200 may preferably be set to fall within a range of room temperature or more and 300 degrees C. or less, specifically room temperature or more and 200 degrees C. or less, more specifically room temperature or more and 100 degrees C. or less.

By supplying the TiCl$_4$ gas to the wafers 200 under the aforementioned conditions, a first layer, for example, a Ti-containing layer containing Cl and having a thickness of from less than one atomic layer to several atomic layers, is formed on the wafer 200 (on an underlying film of the surface of the wafer 200). The Ti-containing layer containing Cl may be a Ti layer containing Cl, an adsorption layer of TiCl$_4$, or a layer including the Ti layer and the adsorption layer of TiCl$_4$.

The Ti layer containing Cl is a generic name that encompasses a continuous or discontinuous layer containing Cl, which is composed of Ti, and a Ti thin film including C and Cl, which is formed of the layers overlapping with one another. The continuous layer containing Cl, which is composed of Ti, is sometimes referred to as a Ti thin film containing Cl. The Ti which constitutes the Ti layer containing Cl includes not only Ti whose bond to Cl is not completely broken, but also Ti whose bond to Cl is completely broken.

The adsorption layer of TiCl$_4$ includes not only a continuous adsorption layer of TiCl$_4$ but also a discontinuous adsorption layer thereof. That is to say, the adsorption layer of TiCl$_4$ includes an adsorption layer having a thickness of one molecular layer or less than one molecular layer, which is composed of TiCl$_4$ molecules. The TiCl$_4$ molecules that constitute the adsorption layer of TiCl$_4$ include a molecule in which Ti—Cl bonds are partially broken. That is to say, the adsorption layer of TiCl$_4$ includes a chemical adsorption layer of TiCl$_4$. Furthermore, the adsorption layer of TiCl$_4$ may include a physical adsorption layer of TiCl$_4$.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Ti-containing layer containing Cl may include both a Ti layer containing Cl and an adsorption layer of $TiCl_4$. As described above, the Ti-containing layer containing Cl will be indicated using expressions such as "one atomic layer", "several atomic layers" and the like.

Under a condition in which the $TiCl_4$ gas is autolyzed (pyrolized), namely a condition in which a pyrolysis reaction of the $TiCl_4$ gas is generated, Ti is deposited on the wafer 200 to thereby form a Ti layer containing Cl. Under a condition in which the $TiCl_4$ gas is not autolyzed (pyrolized), namely a condition in which a pyrolysis reaction of the $TiCl_4$ gas is not generated. $TiCl_4$ is adsorbed onto the wafer 200 to thereby form an adsorption layer of $TiCl_4$, namely a physical adsorption layer of $TiCl_4$ or a chemical adsorption layer of $TiCl_4$. However, under the temperature zone described above, the formation of the Ti layer containing Cl or the formation of the chemical adsorption layer of $TiCl_4$ is more predominant than the formation of the physical adsorption layer of $TiCl_4$. For that reason, the first layer becomes a layer including a large number of Ti layers containing Cl, or a layer including a large number of chemical adsorption layers of $TiCl_4$. The first layer becomes a layer scarcely including a physical adsorption layer of $TiCl_4$. It is more desirable to form a Ti layer containing Cl or a chemical adsorption layer of $TiCl_4$ on the wafer 200 than to form a physical adsorption layer of $TiCl_4$ on the wafer 200, because the deposition rate can be increased by doing so.

If the thickness of the first layer formed on the wafer 200 exceeds several atomic layers, a modification action in step 2 (to be described later) does not affect the entire first layer. In addition, a minimum value of the thickness of the first layer capable of being formed on the wafer 200 is less than one atomic layer. Accordingly, the thickness of the first layer may be set to fall within a range of from less than one atomic layer to several atomic layers. By setting the thickness of the first layer to become one atomic layer or less, namely one atomic layer or less than one atomic layer, it is possible to relatively increase the action of the modification reaction in step 2 (to be described later), thus shortening a period of time required in the modification reaction in step 2. It is also possible to shorten a period of time required in the formation of the first layer in step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

(Residual Gas Removal)

After the first layer is formed, the valve 243a is closed to stop the supply of the $TiCl_4$ gas. At this time, while keeping the APC valve 244 opened, the interior of the process chamber 201 is evacuated by the vacuum pump 246. Thus, the $TiCl_4$ gas remaining within the process chamber 201, which have not reacted or which have contributed to the formation of the first layer, are removed from the interior of the process chamber 201. At this time, while keeping the valves 243d to 243f opened, the supply of the $N_2$ gas into the process chamber 201 is maintained. The $N_2$ gas acts as a purge gas. This makes it possible to enhance the effect of removing the gas remaining within the process chamber 201 from the interior of the process chamber 204. The flow rates of the $N_2$ gas controlled by the MFCs 241d to 241f are the same as those of step 1. A period of time during which the interior of the process chamber 201 is purged with the $N_2$ gas (a purge time period) is set at, for example, 1 to 120 seconds, specifically 1 to 80 seconds, more specifically 1 to 60 seconds.

In this case, the gases remaining within the process chamber 201 may not be completely removed and the interior of the process chamber 201 may not be completely purged. If the amount of the gases remaining within the process chamber 201 is small, an adverse effect may not be generated in step 2 which will be subsequently performed. The flow rate of the $N_2$ gas supplied into the process chamber 201 needs not be made large. For example, an amount of the $N_2$ gas to be supplied into the process chamber 201 may be set substantially equal to the volume of the reaction tube 203 (the process chamber 201). This makes it possible to perform a purge operation without causing an adverse effect in step 2. As such, by not completely purging the interior of the process chamber 201, it is possible to shorten the purge time period, thus improving the throughput. It is also possible to suppress the consumption of the $N_2$ gas to a necessary minimum level.

As the precursor gas, in addition to the $TiCl_4$ gas, it may be possible to use, for example, a precursor gas containing Ti and a fluoro group, such as titanium tetrafluoride ($TiF_4$) or the like. As the inert gas, in addition to the $N_2$ gas, it may be possible to use, for example, rare gases such as an Ar gas, a He gas, a Ne gas, a Xe gas and the like.

[Step 2]

(Supply of $H_2O$ Gas and Pyridine Gas)

After step 1 is completed, a $H_2O$ gas and a pyridine gas are supplied to the wafers 200 accommodated in the process chamber 201.

In this step, the opening losing control of the valves 243b, 243c and 243d to 243f is executed in the same procedure as the opening closing control of the valves 243a and 243d to 243f executed in step 1 supply flow rate of the $H_2O$ gas controlled by the MFC 241b is set at a flow rate which falls within a range of, for example, 100 to 1,000 sccm. A supply flow rate of the pyridine gas controlled by the MFC 241c is set at a flow rate which falls within a range of, for example, 100 to 1,000 sccm. The $H_2O$ gas and the pyridine gas are supplied into the process chamber 201 from the individual nozzles 249b and 249c, respectively, and are mixed (post-mixed) after they are supplied into the process chamber 201. Supply flow rates of the $N_2$ gas controlled by the MFCs 241d to 241f are the same as those of step 1.

The internal pressure of the process chamber 201 is set at a pressure which falls within a range of, for example, 30 to 400 Pa, specifically 30 to 133 Pa. A partial pressure of the $H_2O$ gas within the process chamber 201 is set at a pressure which falls within a range of, for example, 0.1 to 300 Pa. A partial pressure of the pyridine gas within the process chamber 201 is set at a pressure which falls within a range of for example, 0.1 to 300 Pa. By supplying the $H_2O$ gas and the pyridine gas into the process chamber 201 kept under this atmosphere, it is possible to thermally activate (excite) the $H_2O$ gas and the pyridine gas in a non-plasma manner. If the $H_2O$ gas and the pyridine gas are supplied by thermally activating them, it is possible to generate a relatively-soft reaction, thus relatively softly performing an oxidation process which will be described later.

A period of time during which the $H_2O$ gas is supplied to the wafers 200, namely, a gas supply time period (irradiation time period), is set to fall within a range of, for example, 1 to 120 seconds, specifically 1 to 80 seconds, more specifically 1 to 60 seconds. Other processing conditions may be similar to, for example, the processing conditions of step 1.

By supplying the $H_2O$ gas to the wafers 200 under the aforementioned conditions, at least a portion of the first layer (the Ti-containing layer containing Cl) is oxidized (modified). As the first layer is modified, a second layer containing Ti and O, namely a titanium oxide layer ($TiO_2$ layer; hereinafter also referred to as a TiO layer), is formed on each of the wafers 200. When forming the second layer, an impurity such as Cl or the like, which is contained in the first layer, forms a gaseous substance containing at least Cl in the course of a modification reaction generated by the $H_2O$ gas. The gaseous substance is discharged from the interior of the process chamber 201. That is to say, an impurity such as Cl or the like existing in the first layer is extracted or desorbed from the first layer and is eventually separated from the first layer. Thus, the second layer becomes a layer which is smaller in the amount of impurity such as Cl or the like, than the first layer.

By supplying the pyridine gas as a catalyst together with the $H_2O$ gas when the $H_2O$ gas is supplied to the wafers 200, it is possible to enhance the efficiency of the aforementioned oxidation reaction generated by the $H_2O$ gas. One of the factors for this appears to be that the pyridine gas acts on an O—H bond of the $H_2O$ gas and weakens the bonding force between O and H. The H whose bonding force is weakened due to the action of the pyridine gas reacts with the Cl of the first layer formed on the wafer 200, whereby a gaseous substance containing Cl and H, such as HCl or the like, is generated. The H is separated from the $H_2O$ molecule and the Cl is desorbed from the first layer. The O of the $H_2O$ gas that has lost the H is bonded to the Ti of the first layer which has a dangling bond as a result of desorption of the Cl.

The reason for the bonding force of the O—H bond of the $H_2O$ gas being weakened by the catalytic action of the pyridine gas is that the N existing in a pyridine molecule and having a lone pair of electrons acts to attract the H. For example, the aforementioned acid dissociation constant (pKa) may be used as one index of the magnitude of the H attraction action of a predetermined compound containing N. As described above, the pKa is a constant that represents, in terms of a negative common logarithm, the equilibrium constant Ka in as dissociation reaction in which H ions are released from an acid. A compound having a large pKa is strong in H-attracting force. For example, by using a compound having a pKa of 5 or more as a catalyst, it is possible to appropriately weaken the bonding force of the O—H bond of the $H_2O$ gas and to promote the aforementioned oxidation reaction. On the other hand, if a compound having an excessively-large pKa is used as a catalyst, the Cl extracted from the first layer is bonded to the catalyst. Thus, there may be a case where a salt (ion compound) such as ammonium chloride ($NH_4Cl$) or the like is generated and becomes a source of particles. In order to suppress this situation, the pKa of a catalyst may preferably be set at, for example, 11 or less, specifically 7 or less. The pyridine gas has a relatively large pKa of 5.67 and has a large H-attracting force. Since the pKa is 7 or less, particles are hardly generated.

(Residual Gas Removal)

After the second layer is formed, the valves 243b and 243c are closed to stop the supply of the $H_2O$ gas and the pyridine gas. Then, according to the same processing procedures and the same processing, conditions as those of step 1, the $H_2O$ gas, the pyridine gas and the reaction byproduct remaining within the process chamber 201, which have not reacted or which have contributed to the formation of the second layer, are removed from the interior of the process chamber 201. At this time, similar to step 1, the gases and the like remaining within the process chamber 201 may not be completely removed.

As the oxidant, in addition to the $H_2O$ gas, it may be possible to use, for example, a gas containing O and H (a gas containing an O—H bond) such as a hydrogen peroxide ($H_2O_2$) gas or the like, a combination of a hydrogen ($H_2$) gas and an oxygen ($O_2$) gas, or a combination of a $H_2$ gas and an ozone ($O_3$) gas. As the catalyst gas, in addition to the pyridine gas, it may be possible to use, for example, various kinds of amine-based gases or non-amine-based gases described above. As the inert gas, in addition to the $N_2$ gas, it may be possible to use, for example, various kinds of rare gases described above.

(Performing Cycle a Predetermined Number of Times)

The cycle which non-simultaneously performs steps 1 and 2 described above is implemented once or more (a predetermined number of times) to thereby form a TiO film having a predetermined composition and a predetermined thickness on the wafer 200. The aforementioned cycle may preferably be repeated multiple times. That is to say, a thickness of the TiO layer formed per one cycle may be set to become smaller than a predetermined film thickness. The aforementioned cycle may preferably be repeated multiple times until the predetermined film thickness is obtained. For example, the thickness of the TiO layer formed per one cycle may be set at 0.1 to 1 nm and the aforementioned cycle may preferably be repeated multiple times until the thickness of the TiO film becomes equal to a predetermined film thickness, for example, 10 to 20 nm.

In the case where the cycle is performed multiple times, in respective steps performed after at least the second cycle, the expression reading "a predetermined gas is supplied to the wafer 200" means that "a predetermined gas is supplied to the layer formed on the wafer 200, namely the uppermost surface of the wafer 200 as a laminated body," The expression reading "a predetermined layer is formed on the wafer 200" means that "a predetermined layer is formed on the layer formed on the wafer 200, namely the uppermost surface of the wafer 200 as a laminated body." This is the same as described above. This holds true in modifications and other embodiments which will be described later.

(Purging and Atmospheric Pressure Restoring)

The valves 243d to 243f are opened. The $N_2$ gas is supplied into the process chamber 201 from each of the gas supply pipes 232d to 232f and is exhausted from the exhaust pipe 231. The $N_2$ gas serves as a purge gas. Thus, the interior of the process chamber 201 is purged so that the gases or the reaction byproducts remaining within the process chamber 201 are removed from the interior of the process chamber 201 (in a purging process). Thereafter, an internal atmosphere of the process chamber 201 is substituted with an inert gas (in an inert gas substituting process), and the internal pressure of the process chamber 201 is returned to an atmospheric pressure (in an atmospheric pressure restoring process).

(Boat Unloading and Wafer Discharge)

The seal cap 219 is moved down by the boat elevator 115 to open the lower end of the manifold 209. The processed wafers 200 supported by the boat 217 are unloaded from the lower end of the manifold 209 to the outside of the reaction tube 203 in a boat unloading process). Thereafter, the processed wafers 200 are discharged from the boat 217 in a wafer discharging process).

(3) Effects According to this Embodiment

According to this embodiment, one or more effects may be achieved as follows.

(a) in step 2, by supplying the pyridine gas together with the $H_2O$ gas, it is possible to promote decomposition of the $H_2O$ gas and to enhance the oxidation power of the $H_2O$ gas. Thus, even under a low temperature condition of for example, room temperature or more and 300 degrees C. or less, it is possible to cause the first layer and the $H_2O$ gas to efficiently react with each other, thereby increasing a modification rate of the first layer. That is to say, due to the catalytic action of the pyridine gas, it is possible to reduce the deposition temperature of the TiO film and to increase the deposition rate of the TiO film, thereby improving the productivity of the film forming process.

(b) In step 2, by supplying the pyridine gas together with the $H_2O$ gas and increasing the oxidation power of the TiO gas, it is possible to promote desorption a Cl from the first layer. This makes it possible to have the TiO film become a film having a small amount of impurity such as Cl or the like. That is to say, it is possible to improve the quality of the TiO film.

(c) In step 1, by not supplying the pyridine gas, it is possible to improve the quality of the TiO film. If a catalyst such as the pyridine gas or the like is supplied when supplying the $TiCl_4$ gas, the $TiCl_4$ gas reacts with the catalyst. Thus, an excessive gas phase reaction is likely to occur. The present inventors have found that if a catalyst such as the pyridine gas or the like is supplied together with the $TiCl_4$ gas, a reaction byproduct such as a pyridine salt or the like generated by an excessive gas phase reaction is introduced into the film or adheres to the film as a powdery foreign matter, consequently making it difficult to form the TiO film. That is to say, the present inventors have found that if the $TiCl_4$ gas and the pyridine gas are simultaneously supplied, the pyridine gas does not act as a catalyst in the reaction system. In contrast, as in this embodiment, by not supplying the pyridine gas when supplying the $TiCl_4$ gas, it is possible to suppress the aforementioned excessive gas phase reaction and to avoid reduction in the quality of the TiO film. Furthermore, the present inventors have found that even if a catalyst such as the pyridine gas or the like is supplied when supplying the $H_2O$ gas, the pyridine gas properly acts as a catalyst and the quality of the TiO film is not reduced, without generating the aforementioned excessive gas phase reaction.

(d) By using the titanium halide precursor gas not containing N and C, such as the $TiCl_4$ gas or the like, it is possible to have the TiO film become a film having a small amount of impurity such as C or N. In the case where a precursor gas containing Ti and an amino group, such as a tetrakis (dimethylamino) titanium ($Ti[N(CH_3)_2]_4$, abbreviation: TDMAT) gas or the like, namely a titanium precursor gas containing N and C, is used in step 1, an N component or a C component contained in the precursor gas is often introduced into the TiO film. In contrast, if an amino-group free precursor gas, namely a N- and C-tree precursor gas, is used as in this embodiment, it is possible to avoid the introduction of the C or N component into the TiO film and to have the finally-formed TiO film become a film having a low concentration of impurity such as C or N. This enables the TiO film to become, for example, a film having a high insulating property, namely a film having a high leak resistance.

(e) By using the titanium halide precursor gas, such as the $TiCl_4$ gas or the like, which contains a plurality of halogen elements (Cl) in one molecule, even under a low temperature condition of, for example, room temperature or more and 300 degrees C. or less, it is possible to efficiently form the first layer and to increase the deposition rate of the TiO film. In addition, it is possible to reduce the consumption amount of the $TiCl_4$ gas not contributed to film formation and to reduce a film formation cost.

(f) By non-simultaneously, i.e., alternately, performing the supply of the $TiCl_4$ gas and the supply of the $H_2O$ gas it is possible to cause the gases to appropriately pro react with each other under a condition in which a surface reaction is dominant. As a result, it is possible to enhance a step coverage of the TiO film and a film thickness controllability, it is also possible to avoid an excessive gas phase reaction otherwise generated within the process chamber 201 and to suppress generation of particles.

(g) The respective effects described above can be similarly achieved in a case where a gas other than the $H_2O$ gas is used as the precursor gas, a case where an oxygen-containing gas other than the $H_2O$ gas is used as the oxidant, or a case where an amine-based gas or a non-amine-base gas other than the pyridine gas is used as the catalyst.

(4) Modifications

The film forming process according to this embodiment is not limited to the aspect described above and may be modified as in the modifications which will be described below.

Figure 4:
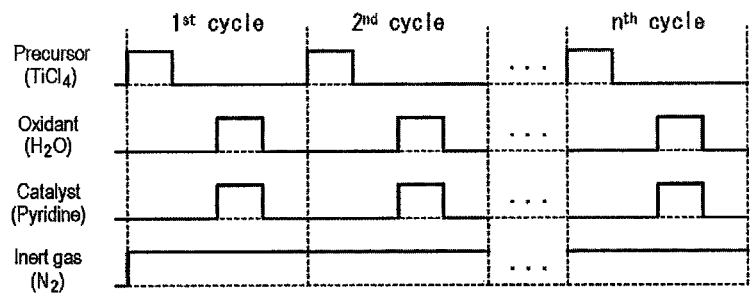
FIG. 4 is a view illustrating gas supply timings in a film forming sequence according to one embodiment of the present disclosure.
Figure 5:
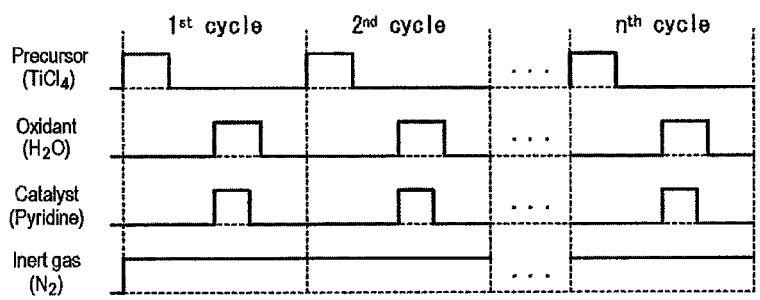
FIG. 5 is a view illustrating modification 1 of the gas supply timings in the film forming sequence according to one embodiment of the present disclosure.

For example, as in modification 1 illustrated in FIG. 5, in step 2, the supply of pyridine gas may be stopped earlier than when the supply of the $H_2O$ gas is stopped. Except for this point, processing procedures and processing conditions of this modification are the same as those of the film forming sequence illustrated in FIG. 4.

Figure 6:
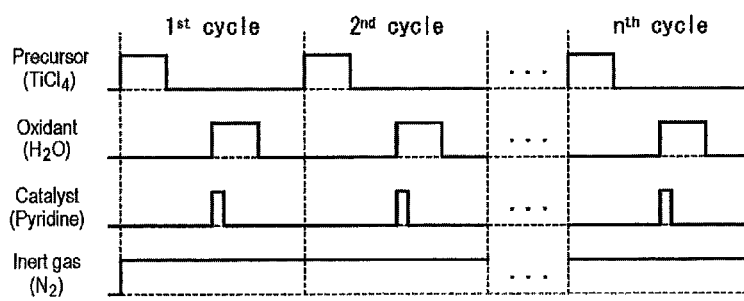
FIG. 6 is a view illustrating modification 2 of the gas supply timings in the film forming sequence according to one embodiment of the present disclosure.

For example, as in modification 2 illustrated in FIG. 6, in step 2, the supply of the pyridine gas may be performed in an initial stage if a supply time period of the $H_2O$ gas. Except for this point, processing procedures and processing conditions of this modification are the sat those of the film forming sequence illustrated in FIG. 4.

Figure 7:
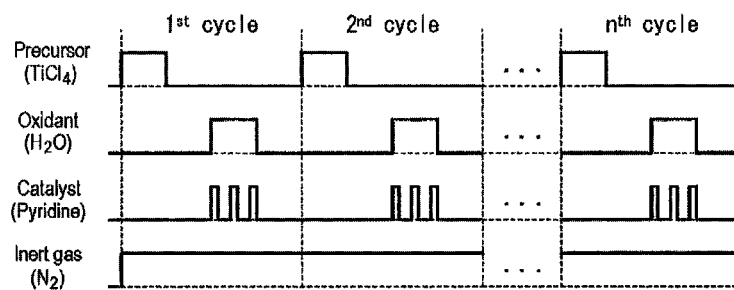
FIG. 7 is a view illustrating modification 3 of the gas supply timings in the film forming sequence according to one embodiment of the present disclosure.

For example, as in modification 3 illustrated in FIG. 7, in step 2, the supply of the pyridine gas may be intermittently performed multiple times during a supply time period of the $H_2O$ gas. Except for this point, processing procedures and processing conditions of this modification are the same as those of the film forming sequence illustrated in FIG. 4. FIG. 7 illustrates an example in which the supply of the pyridine gas is intermittently performed three times during the supply time period of the $H_2O$ gas.

Figure 8:
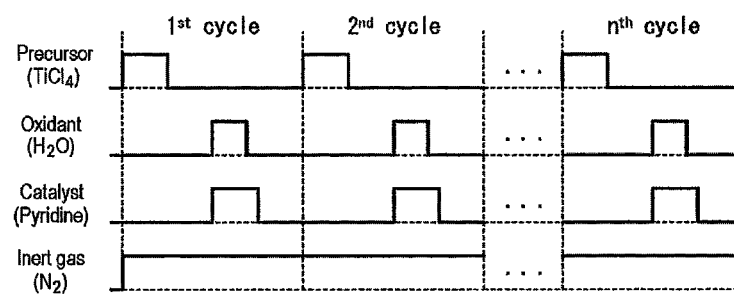
FIG. 8 is a view illustrating modification 4 of the gas supply timings in the film forming sequence according to one embodiment of the present disclosure.

For example, as modification 4 illustrated FIG. 8, in step 2, the supply of the $H_2O$ gas may be stopped earlier than when the supply of the pyridine gas is stopped. Except for this point, processing procedures and processing conditions, of this modification are the same as those of the film forming sequence illustrated in FIG. 4.

Figure 9:
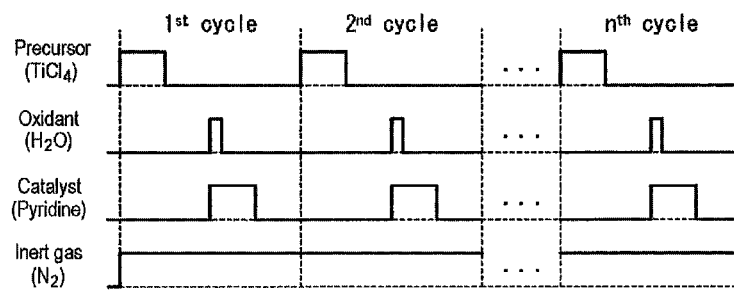
FIG. 9 is a view illustrating modification 5 of the gas supply timings in the film forming sequence according to one embodiment of the present disclosure.

For example, as in modification 5 illustrated in FIG. 9, in step 2, the supply of the $H_2O$ gas may be performed in an initial stage of a supply time period of the pyridine gas. Except for this point, processing procedures and processing conditions of this modification are the same as those of the film forming sequence illustrated in FIG. 4.

Figure 10:
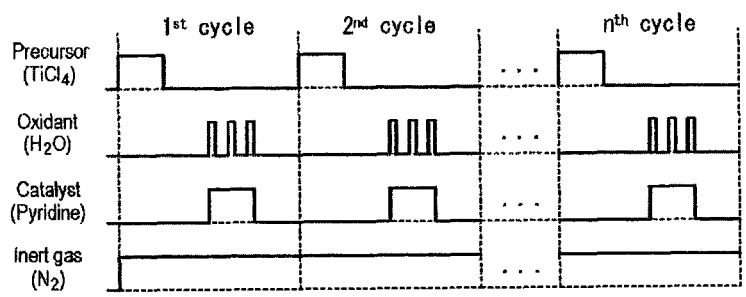
FIG. 10 is a view illustrating modification 6 of the gas supply timings in the film forming sequence according to one embodiment of the present disclosure.

For example, as in modification 6 illustrated in FIG. 10, step 2, the supply of the $H_2O$ gas may be intermittently performed multiple times during a supply time period of the pyridine gas. Except for this point, processing procedures and processing conditions of this modification are the same as those of the film illustrated in FIG. 4. FIG. 10 illustrates an example in which the supply of the $H_2O$ gas intermittently performed three times during the supply time period of the pyridine gas.

Even in these modifications, the effects similar to the effects of the film forming sequence illustrated in FIG. 4 may be achieved, in modifications 1 and 2, by stopping the supply of the pyridine gas earlier than the stop of the supply of the $H_2O$ gas, namely by continuously supplying the $H_2O$ gas even after the supply of the pyridine gas is stopped, it is possible to promote the exhaust of the pyridine gas from the interior of the process chamber 201. As a result, in step 1 of the subsequent cycle, it is possible to reliably avoid generation of an excessive gas phase reaction between the $TiCl_4$ gas and the pyridine gas and to further improve the quality of the TiO film. In modifications 1 to 3, the supply time period of the pyridine gas is made shorter than the supply time period of the $H_2O$ gas. It is therefore possible to reduce the consumption amount of the pyridine gas not contributed to and to reduce the film formation cost.

Other Embodiments of the Present Disclosure

While one embodiment of the present disclosure has been specifically described above, the present disclosure is not limited to the aforementioned embodiment but may be differently modified without departing from the spirit of the present disclosure.

In the aforementioned embodiment, there has been described an example in which the $TiO_2$ film whose composition ratio is a stoichiometric composition (Ti/O=½) is formed. The present disclosure is not limited to this aspect. It may be possible to form a $TiO_x$ film whose composition ratio differs from a stoichiometric composition. For example, by keeping the oxidation reaction generated in step 2 unsaturated, it is possible to form a Ti-rich (or O-poor) $TiO_x$ film in which the amount of Ti is than the amount of Ti in the $TiO_2$ film having a stoichiometric composition. For example, in step 2, by reducing the internal pressure of the process chamber 201, reducing the partial pressure of the oxidant or the catalyst, or reducing the supply flow rate of the oxidant or the catalyst, it is possible to keep the oxidation reaction in step 2 unsaturated. According to the methods of modifications 1 to 3, it is easy to keep the oxidation reaction in step 2 unsaturated.

In the aforementioned embodiment, there has been described an example in which the oxidant and the catalyst are supplied after supplying the precursor. The present disclosure is not limited to, this aspect. The supply order of the precursor, the oxidant and the catalyst may be reversed. That is to say, the precursor may be supplied after supplying the oxidant and the catalyst. By changing the supply order of the precursor, the oxidant and the catalyst, it is possible to change the quality or composition ratio of a metal oxide film as formed.

In the aforementioned embodiment, there has been described an example in which a film containing Ti as a transition element is formed. The present disclosure is not limited to the embodiment described above but may be applied to a case where a metal-based oxide film containing a transition metal element such as zirconium (Zr), hafnium (Hf), tantalum (Ta), niobium (Nb), molybdenum (Mo), tungsten (W) or the like or a typical metal element such as aluminum (Al) or the like is formed. That is to say, the present disclosure may be applied to a case where a metal-based oxide film such as, e.g., a ZrO film, a HfO film, a TaO film, a NbO film, a MoO film, a WO film, an AlO film or the like, is formed. In this case, a precursor containing a metal element such as Zr, Hf, Ta, Nb, Mo, W, Al or the like may be used in place of the Ti-containing precursor used in the aforementioned embodiment. A film formation process may be performed by the same sequence as those of the embodiment and modifications described above.

In the case of forming a Zr-based oxide film, as a precursor containing Zr, it may be possible to use, for example, a precursor containing Zr and a halogen element. As the precursor containing and a halogen element, it may be possible to use, for example, a precursor containing Zr chloro group, such as zirconium tetrachloride ($ZrCl_4$) or the like, or a precursor containing Zr and a fluoro group, such as zirconium tetrafluoride ($ZrF_4$) or the like. As the oxidant and the catalyst, it may be possible to use the same oxidant and catalyst as used in the aforementioned embodiment. Processing conditions applied at this time may be the same as fir example, the processing conditions applied in the aforementioned embodiment.

In the case of forming an Hf-based oxide film, as a precursor contain Hf, may be possible to use for example, a precursor containing Hf and a halogen element. As the precursor containing Hf acid a halogen element, it may be possible to use, for example, a precursor containing Hf and a chloro group, such as hafnium tetrachloride ($HfCl_4$) or the like, or a precursor containing Hf and a fluoro group, such as hafnium tetrafluoride ($HfF_4$) or the like. As the oxidant and the catalyst, it may be possible to use the same oxidant and catalyst as used in the aforementioned embodiment. Processing conditions applied at this time may be the same as, for example, the processing conditions applied in the aforementioned embodiment.

In the case of forming a Ta-based oxide film, as a precursor containing Ta, it may be possible to use, for example, a precursor containing Ta and a halogen element. As the precursor containing Ta and a halogen element, it may be possible to use, for example, a precursor containing Ta and a chloro group, such as tantalum pentachloride ($TaCl_5$) or the like, or a precursor containing Ta and a fluoro group such as tantalum pentafluoride ($TaF_5$) or the like. As the oxidant and the catalyst, it may be possible to the same oxidant and catalyst as used in the aforementioned embodiment. Processing conditions applied at this time may be the same as, for example, the processing conditions applied in the aforementioned embodiment.

In the case of forming an Nb-based oxide film, as a precursor containing Nb, it may be possible to use, for example, a precursor containing Nb and a halogen element. As the precursor containing Nb and a halogen element, it may be possible to use, for example, a precursor containing Nb and a chloro group, such as niobium pentachloride ($TaCl_5$) or the like, or a precursor containing Nb and a fluoro group, such as niobium pentafluoride ($TaF_5$) or the like. As the oxidant and the catalyst, it may be possible to use the same oxidant and catalyst as used in the aforementioned embodiment. Processing conditions applied at this time may be the same as, for example, the processing conditions applied in the aforementioned embodiment.

In the case of forming an Mo-based oxide film, as a precursor containing Mo, it may be possible to use, for example, a precursor containing Mo and a halogen element. As the precursor containing Mo and a halogen element, it may be possible to use, for example, a precursor containing Mo and a chloro, such as molybdenum pentachloride ($MoCl_5$) or the like, or a precursor containing Mo and a fluoro group, such as molybdenum pentafluoride ($MoF_5$) or the like. As the oxidant and the catalyst, it may be possible to use the same oxidant and catalyst as used in the aforementioned embodiment. Processing conditions applied at this time may be the same as, for example, the processing conditions applied in the aforementioned embodiment.

In the case of forming a W-based oxide film, as a precursor containing W, it may be possible to use, for example, a precursor containing W and a halogen element. As the precursor containing W and a halogen element, at may be possible to use, for example, a precursor containing W and a chloro group, such as hexachloride ($WCl_6$) or the like, or a precursor containing W and a fluoro group, such as tungsten hexafluoride ($WF_6$) or the like. As the oxidant and the catalyst, it may be possible to use the same oxidant and catalyst as used in the aforementioned embodiment. Processing conditions applied at this time may be the same as, for example, the processing conditions applied in the aforementioned embodiment.

In the case of forming an Al-based oxide cursor containing Al, it may be possible to use, for example, a precursor containing Al and a halogen element. As the precursor containing Al and a halogen element, it may be possible to use, for example, a precursor containing Al and a chloro group, such as aluminum trichloride ($AlCl_3$) or the like, or a precursor containing Al and a fluoro group, such as aluminum trichloride ($AlF_3$) or the like. As the oxidant and the catalyst, it may be possible to use the same oxidant and catalyst as used in the aforementioned embodiment. Processing conditions applied at this time may be the same as, for example, the processing conditions applied in the aforementioned embodiment.

As described above, the present disclosure may be applied to not only the formation of a TiO film but also the formation of an oxide film containing a transition metal element other than Ti or an oxide film containing a typical metal element. Even in this case, the effects similar to the effects of the aforementioned embodiment may be achieved.

Process recipes (programs describing processing procedures and processing conditions of a film-forming process) used in the film-forming process of various kinds of thin films may be prepared individually (in a plural number) according to the contents of the film-forming process (the kind, composition ratio, film quality and thickness of a thin film as formed, the gas supply pattern, the processing conditions such as the film formation temperature or the internal pressure of the process chamber, etc.). When starting the substrate process, according to the contents of the substrate process, a proper recipe may be appropriately selected from the plurality of recipes. Specifically, the plurality of recipes prepared individually according to the contents of the substrate process may be pre-stored (installed) in the memory device 111c of the substrate processing apparatus via a telecommunication line or a recording medium (the external memory device 123) which records the recipes. At the start of the substrate process, the CPU 21a of the substrate processing apparatus may appropriately select a proper recipe from the plurality of recipes stored in the memory device 121c according to the contents of the substrate process. This configuration enables a single substrate processing apparatus to form thin films of different kinds, composition ratios, film qualities and thicknesses for a general purpose and with enhanced reproducibility. In addition, this configuration makes it possible to reduce an operator's operation burden (e.g., a burden borne by an operator when inputting processing procedures and processing conditions) and to quickly start the substrate process while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be preferably applied to, for example, a case where thin films are formed using, a single-substrate-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be preferably applied to a case where thin films are formed using a substrate processing apparatus provided with a cold-wall-type processing furnace. Even in these cases, the processing procedures and the processing conditions may be the same as, for example, the processing procedures and processing conditions, of the aforementioned embodiment.

Figure 15:
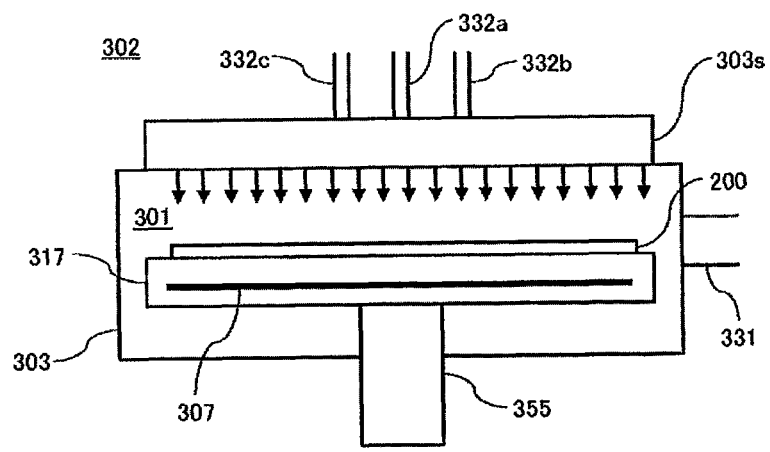
FIG. 15 is a schematic configuration view of a processing furnace of a substrate processing apparatus used in another embodiment of the present disclosure, in which a portion of the processing furnace is shown in a vertical cross section.

The present disclosure may be preferably applied to, for example, a case where a film is formed using a substrate processing apparatus provided with a processing furnace 302 illustrated in FIG. 15. The processing furnace 302 includes a process vessel 303 which defines a process chamber 301, a shower head 303s configured to supply gases into the process chamber 301 in a shower-like manner, a support table 317 configured to horizontally support one or more wafers 200, a rotary shaft 355 configured to support the support table 317 from below, and a heater 307 installed in the support table 317. Inlets (gas introduction holes) of the shower head 303s are connected to a gas supply port 332a through which the aforementioned precursor is supplied, a gas supply port 332b through which the aforementioned oxidant is supplied and a gas supply port 332c through which the aforementioned catalyst is supplied. A precursor supply system similar to the precursor supply system of the aforementioned embodiment is connected to the gas supply port 332a. An oxidant supply system similar to the oxidant supply system of the aforementioned embodiment is connected to the gas supply port 332b. A catalyst supply system similar to the catalyst supply system of the aforementioned embodiment is connected to the gas supply port 332c. A gas distribution plate configured to supply gases into the process chamber 301 in a shower-like manner is installed in outlets (gas discharge holes) of the shower head 303s. The shower head 303s may be configured so that the oxidant and the catalyst simultaneously introduced from the gas supply ports 332b and 332c are not mixed (pre-mixed) within the shower head 303s and so that that the oxidant and the catalyst simultaneously introduced from the gas supply ports 332b and 332c are individually supplied into the process chamber 301 and are mixed (post-mixed) within the process chamber 301. An exhaust port 331 through which the interior of the process chamber 301 is exhausted, is installed in the process vessel 303. An exhaust system similar to the exhaust system of the aforementioned embodiment is connected to the exhaust port 331.

Figure 16:
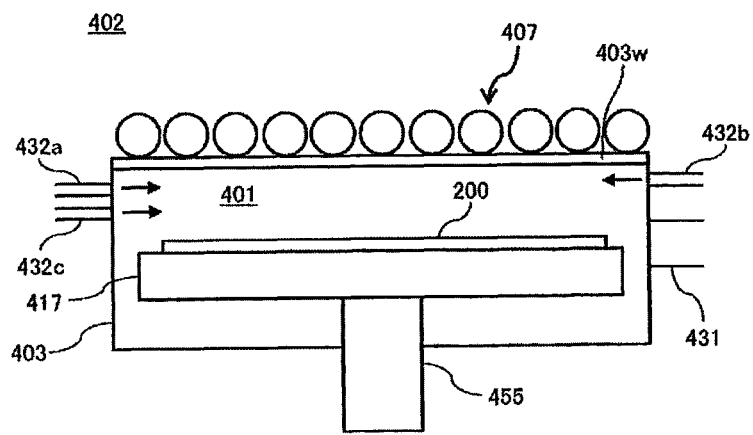
FIG. 16 is a schematic configuration view of a processing furnace of a substrate processing apparatus preferably used in another embodiment of the present disclosure, in which a portion of the processing furnace is shown in a vertical cross section.
Figure 17B:
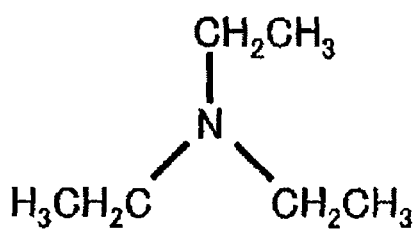
FIG. 17B is a view illustrating a name, a chemical composition formula, a chemical structural formula and an acid dissociation constant of TEA which is a chain amine.
Figure 17C:
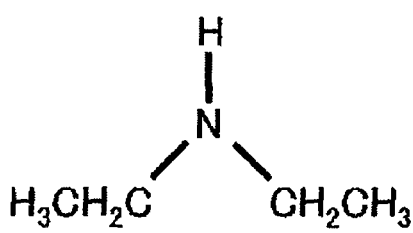
FIG. 17C is a view illustrating a name, a chemical composition formula, a chemical structural formula and an acid dissociation constant of DEA which is a chain amine.
Figure 17D:
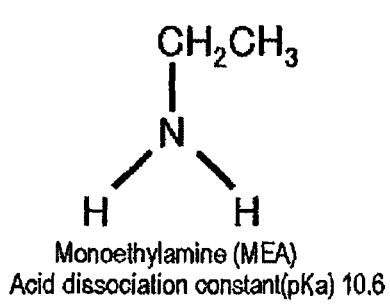
FIG. 17D is a view illustrating a name, a chemical composition formula, a chemical structural formula and an acid dissociation constant of MEA which is a chain amine.
Figure 17E:
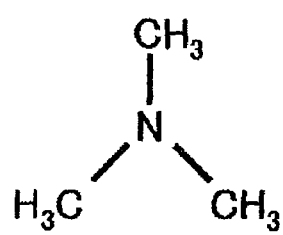
FIG. 17E is a view illustrating a name, a chemical composition formula, a chemical structural formula and an acid dissociation constant of TMA which is a chain amine.
Figure 17F:
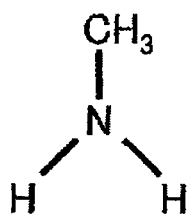
FIG. 17F is a view illustrating a name, a chemical composition formula, a chemical structural formula and an acid dissociation constant of MMA which is a chain amine.

In addition, the present disclosure may be preferably applied to, e.g., a case where films are formed using, a substrate processing apparatus provided with a processing furnace 402 illustrated in FIG. 16. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a through which the aforementioned precursor is supplied, a gas supply port 432b through which the aforementioned oxidant is supplied and a gas supply port 432c through which the aforementioned catalyst is supplied, are connected to the process vessel 403. A precursor supply system similar to the precursor supply system of the aforementioned embodiment is connected to the gas supply port 432a. An oxidant supply system similar to the oxidant supply system of the aforementioned embodiment is connected to the gas supply port 432b. A catalyst supply system similar to the catalyst supply system of the aforementioned embodiment is connected to the gas supply port 432c. An exhaust port 431 through which the interior of the process chamber 401 is exhausted, is installed in the process vessel 403. An exhaust system similar to the exhaust system of the aforementioned embodiment is connected to the exhaust port 431.

Even in the case of using these substrate processing apparatuses, a film forming process may be performed according to the sequences and processing conditions similar to those of the embodiments and modifications described above.

The embodiments and modifications described above may be appropriately combined with one another. In addition, processing conditions applied at this time may be similar to, for example, the processing conditions of the embodiments described above.

Examples

As an example, a TiO film was formed according to the film forming sequence illustrated in FIG. 4 using the substrate processing apparatus of the aforementioned embodiment. That is to say, in a step of supplying an oxidant, a catalyst was supplied to a wafer together with the oxidant. In a step of supplying a precursor, the catalyst was not supplied to the wafer. A $TiCl_4$ gas was used as the precursor. A $H_2O$ gas was used as the oxidant. A pyridine gas was used as the catalyst. Processing conditions were set at conditions which fall within the processing conditions described in the aforementioned embodiment.

Figure 11:
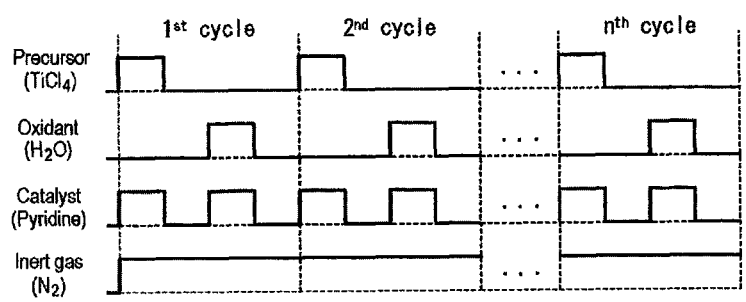
FIG. 11 is a view illustrating gas supply timings in a film forming sequence according to comparative example 1.

As a comparative example 1, a TiO film was formed according to the film forming sequence illustrated in FIG. 11 using the substrate processing apparatus of the aforementioned embodiment. That is to say, in both a step of supplying an oxidant and in a step of supplying a precursor, a catalyst was supplied to the wafer. A $TiCl_4$ gas was used as the precursor. A gas was used as the oxidant. A pyridine gas was used as the catalyst. Processing conditions were set at conditions which fall within the processing conditions described in the aforementioned embodiment.

Figure 12:
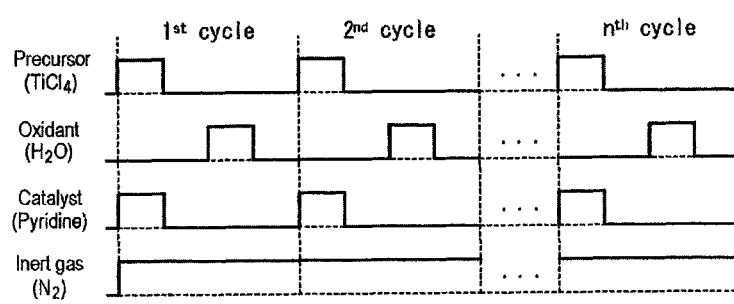
FIG. 12 is a view illustrating gas supply timings in a film forming sequence according to comparative example 2.

As a comparative example 2, a TiO film was formed according to the film forming sequence illustrated in FIG. 12 using the substrate processing apparatus of the aforementioned embodiment. That is to say, in a step of supplying an oxidant, a catalyst was not supplied to a wafer. In a step of supplying a precursor, the catalyst was supplied to the wafer together with the precursor A $TiCl_4$ gas was used as the precursor. A $H_2O$ gas was used as the oxidant. A pyridine gas was used as the catalyst. Processing conditions were set at conditions which fall within the processing conditions described in the aforementioned embodiment.

As a comparative example 3, a TiO film was formed according to the film forming sequence illustrated in FIG. 13 using the substrate processing apparatus of the aforementioned embodiment. That is to say, in both a step of supplying an oxidant and in a step of supplying a precursor, a catalyst was not supplied to the wafer. A $TiCl_4$ gas was used as the precursor. A $H_2O$ gas was used as the oxidant. Processing conditions were set at conditions which fall within the processing conditions described in the aforementioned embodiment.

Deposition rates of the TiO films formed in the present example and the respective comparative examples were measured. Furthermore, the respective films thus formed were visually confirmed. FIG. 14A is a view illustrating some evaluation results of the deposition rates of the TiO films. The vertical axis in FIG. 14A indicates the deposition rates (Å/min) of the TiO films. The horizontal axis indicates comparative example 3 and the present example in order. FIG. 14B is a view collectively illustrating evaluation results of the deposition rates of the TiO films and the visual inspection thereof.

According to FIGS. 14A and 14B, it can be noted that the deposition rate (4.57 Å/min) of the present example is about five times as high as the deposition rate (0.95 Å/min) of the comparative example 3. From this result, it can be seen that in the step of supplying the $H_2O$ gas, the deposition rate of the TiO film is significantly increased by supplying the pyridine gas to the wafer together with the $H_2O$ gas. Furthermore, in both the comparative examples 1 and 2, an excessive gas phase reaction between the $TiCl_4$ gas and the pyridine gas was generated. It was impossible to form a proper TiO film and to measure a deposition rate. A powdery foreign matter generated by the excessive gas phase reaction was introduced into the films formed in the comparative examples 1 and 2 in a visually confirmable amount. Furthermore, the powdery foreign matter adhered to the films in a visually confirmable amount. The powdery foreign matter was not introduced into the films formed in the present example and the comparative example 3. Furthermore, the powdery foreign matter did not adhere to the films. From this result, it can be seen that in the step of supplying the $TiCl_4$ gas, by not supplying the pyridine gas to the wafer, it is possible to suppress generation of the excessive as phase reaction and to improve the quality of the TiO film.

Preferred Aspects of the Present Disclosure

Hereinafter, preferred aspects of the present disclosure will be described as supplementary notes.
(Supplementary Note 1)
According to one aspect of the present disclosure, there is provided a semiconductor device manufacturing method and a substrate processing, method, which include forming an oxide film containing a metal element on a substrate by performing a cycle a predetermined number of times, the cycle including non-simultaneously performing:
supplying a precursor containing a metal element and a halogen group (halogen element) to the substrate; and
supplying an oxidant to the substrate, wherein in the act of supplying the oxidant, a catalyst is supplied to the substrate together with the oxidant, and in the act of supplying the precursor, the catalyst is not supplied to the substrate.

(Supplementary Note 2)

In the method of Supplementary Note 1, the precursor may be nitrogen-free.

(Supplementary Note 3)

In the method of Supplementary Note 1 or 2, the precursor may be carbon-free.

(Supplementary Note 4)

In the method of any one of Supplementary Notes 1 to 3, the precursor may be nitrogen- and carbon-free.

(Supplementary Note 5)

In the method of any one of Supplementary Notes 1 to 4, the precursor may be an amino-group-free.

(Supplementary Note 6)

In the method of any one of Supplementary Notes 1 to 5, the halogen group may include a chloro group, a fluoro group, a bromo group or an iodine group.

(Supplementary Note 7)

In the method of any one of Supplementary Notes 1 to 6, the halogen group may include a chloro group.

(Supplementary Note 8)

In the method of any one of Supplementary Notes 1 to 7, the metal element may include a transition metal (Ti, Zr, Hf, Ta, Nb, Mo, W, etc.) or a typical metal (Al, etc.).

(Supplementary Note 9)

In the method of any one of Supplementary Notes 1 to 8, the metal element may include a transition metal.

(Supplementary Note 10)

In the method of any one of Supplementary Notes 1 to 9, the precursor may include a metal halide.

(Supplementary Note 11)

In the method of any one of Supplementary Notes 1 to 10, the precursor may include a titanium halide ($TiCl_4$).

(Supplementary Note 12)

In the method of any one of Supplementary Notes 1 to 11, the oxidant may include $H_2O$ or $H_2O_2$.

(Supplementary Note 13)

In the method of any one of Supplementary Notes 1 to 12, the catalyst may include an amine-based catalyst.

(Supplementary Note 14)

According to another aspect of the present disclosure, there is provided a substrate processing apparatus, including:

a process chamber configured to accommodate a substrate;

a precursor supply system configured to supply a precursor containing a metal element and a halogen group to the substrate accommodated in the process chamber;

an oxidant supply system configured to supply an oxidant to the substrate accommodated in the process chamber;

a catalyst supply system configured to supply a catalyst to the substrate accommodated in the process chamber; and a control part configured to control the precursor supply system, the oxidant supply system and the catalyst supply system so as to perform forming an oxide film containing the metal element on the substrate by performing a cycle a predetermined number of times, the cycle including non simultaneously performing: supplying the precursor to the substrate accommodated in the process chamber, and supplying the oxidant to the substrate accommodated in the process chamber, wherein in the act of supplying the oxidant, the catalyst is supplied to the substrate together with the oxidant, and in the act of supplying the precursor, the catalyst is not supplied, to the substrate.

(Supplementary Note 15)

According to a further aspect of the present disclosure, there is provided a program and a non-transitory computer-readable recording medium storing the program, wherein the program causes a computer to perform forming an oxide film containing a metal element on a substrate by performing a cycle a predetermined number of times, the cycle including non-simultaneously performing:

supplying a precursor containing a metal element and a halogen group to a substrate accommodated in a process chamber; and supplying an oxidant to the substrate accommodated in the process chamber wherein in the act of supplying the oxidant, a catalyst is supplied to the substrate together with the oxidant, and in the act of supplying the precursor, the catalyst is not supplied to the substrate.

EXPLANATION OF REFERENCE NUMERALS

200: wafer (substrate), 201: process chamber, 207: heater, 232*a* to 232*f*: gas supply pipe, 249*a*, 249*b*, 249*c*: nozzle, 121: controller.

What is claimed is:

1. A method of manufacturing a semiconductor device, comprising:
   forming an oxide film containing a metal element on a substrate by performing a cycle a predetermined number of times, the cycle including non-simultaneously performing:
   supplying a precursor containing the metal element and a halogen group to the substrate; and
   supplying an oxidant to the substrate,
   wherein in the act of supplying the oxidant, a catalyst is supplied to the substrate together with the oxidant, and in the act of supplying the precursor, the catalyst is not supplied to the substrate.

2. The method of claim 1, wherein the precursor is nitrogen-free.

3. The method of claim 1, wherein the precursor is carbon-free.

4. The method of claim 1, wherein the precursor is carbon- and nitrogen-free.

5. The method of claim 1, wherein the precursor is an amino-group-free.

6. The method of claim 1, wherein the halogen group includes a chloro group, a fluoro group, a bromo group or an iodine group.

7. The method of claim 1, wherein the halogen group includes a chloro group.

8. The method of claim 1, wherein the metal element includes a transition metal or a typical metal.

9. The method of claim 1, wherein the metal element includes a transition metal.

10. The method of claim 1, wherein the precursor includes a metal halide.

11. A substrate processing apparatus, comprising:
    a process chamber configured to accommodate a substrate;

a precursor supply system configured to supply a precursor containing a metal element and a halogen group to the substrate accommodated in the process chamber;

an oxidant supply system configured to supply an oxidant to the substrate accommodated in the process chamber;

a catalyst supply system configured to supply a catalyst to the substrate accommodated in the process chamber; and a control part configured to control the precursor supply system, the oxidant supply system and the catalyst supply system so as to perform forming an oxide film containing the metal element on the substrate by performing a cycle a predetermined number of times, the cycle including non-simultaneously performing:

supplying the precursor to the substrate accommodated in the process chamber; and supplying the oxidant to the substrate accommodated in the process chamber, wherein in the act of supplying the oxidant, the catalyst is supplied to the substrate together with the oxidant, and in the act of supplying the precursor, the catalyst is not supplied to the substrate.

12. A non-transitory computer-readable recording medium storing a program that causes a computer to perform forming an oxide film containing a metal element on a substrate by performing a cycle a predetermined number of times, the cycle including non-simultaneously performing:

supplying a precursor containing the metal element and a halogen group to the substrate accommodated in a process chamber; and supplying an oxidant to the substrate accommodated in the process chamber wherein in the act of supplying the oxidant, a catalyst is supplied to the substrate together with the oxidant, and in the act of supplying the precursor, the catalyst is not supplied to the substrate.

* * * * *